(12) United States Patent
Ohmoto et al.

(10) Patent No.: US 6,759,338 B2
(45) Date of Patent: Jul. 6, 2004

(54) PLASMA PROCESSING APPARATUS AND METHOD

(75) Inventors: Yutaka Ohmoto, Hikari (JP); Hironobu Kawahara, Kudamatsu (JP); Ken Yoshioka, Hikari (JP); Kazue Takahashi, Kudamatsu (JP); Saburou Kanai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 114 days.

(21) Appl. No.: 09/795,487

(22) Filed: Mar. 1, 2001

(65) Prior Publication Data

US 2001/0019881 A1 Sep. 6, 2001

(30) Foreign Application Priority Data

Mar. 1, 2000  (JP) ........................................ 2000-060361

(51) Int. Cl.[7] ............................................ H01L 21/302
(52) U.S. Cl. ...................... 438/706; 438/710; 438/712; 438/720; 216/58; 216/67
(58) Field of Search ................................. 438/706, 710, 438/712, 720; 156/345, 345.43; 118/727; 216/58, 67

(56) References Cited

U.S. PATENT DOCUMENTS 5,612,851 A * 3/1997 Barnes et al. ............... 361/234
5,942,039 A * 8/1999 Kholodenko et al. ........ 118/723

* cited by examiner

Primary Examiner—Lan Vinh
(74) Attorney, Agent, or Firm—Antonelli, Terry, Stout & Kraus, LLP

(57) ABSTRACT

A plasma processing apparatus and a plasma processing method for processing a wafer of a large diameter to produce a high speed semiconductor circuit at a high yield are provided. A thickness of an insulating film formed on a surface of an electrode opposing to a substrate to be processed is locally changed, an electrode is provided in the insulating film and a bypassed bias current is supplied to the electrode. An electrode is provided in an insulating film on a surface of the electrode opposing to a material adjacent to the substrate to be processed and a bypassed bias current is supplied to the electrode.

5 Claims, 7 Drawing Sheets

☐ NORMAL CHIP
■ DEFECTIVE CHIP

US 6,759,338 B2

PLASMA PROCESSING APPARATUS AND METHOD

BACKGROUND OF THE INVENTION

The present invention relates to a plasma processing apparatus and method, more particularly to a plasma processing apparatus and method suited to apply a bias voltage to a specimen.

In the conventional plasma etching technique of this type, as disclosed in JP-A-2-65131, it is known that the electrostatic damage has been prevented by providing an electrically conductive ring at a position surrounding the wafer.

As disclosed in JP-A-8-181107, there is known a technique that a surrounding ring formed of ceramic is provided around a lower electrode, a wafer is mounted on the surrounding ring so as to have a space between the wafer and the lower electrode and thereby have an electrostatic capacitance, so that a DC voltage generated in a plasma is distributed into the space, a blocking capacitor and the wafer to prevent occurrence of charging damage to the wafer.

However, the above conventional technique is insufficient to prevent the gate oxide film from the electrostatic damage when the gate oxide film becomes much thinner. Further, it is difficult for all the different processing objects such as different kinds of films, different working shapes such as grooves or holes to achieve both of reduced-damage property and desired etching characteristics within the wafer surface. The etching characteristics include uniformity of etching, etching shape, selectivities to mask and underlayer materials and etching rate.

That is, the semiconductor integrated circuit becomes more minute and more complex for obtaining much higher function and much higher-speed operation. In higher-speed semiconductor devices, the gate oxide film is much thinner, resulting in lower dielectric breakdown voltage as shown in FIG. 1. Thus, in dry etching conducting the plasma processing using charged particles or the like, it is possible that electrostatic damage occurs due to potential difference produced between gate oxide films unless the process is carried out while taking delicate balancing between positive (i.e., ions) and negative charged species (i.e., electrons).

This is because the potential of the wafer base material (silicon) is subjected to the average of the amount of electric charges flowing into the wafer from the plasma, while the potential of the gate oxide film is subjected to the amount of electric charges flowing into the gate oxide film from the local plasma just above the oxide film so that the slight difference in flowing amount of the electric charges over the whole wafer surface produces the potential difference between the areas above and under the oxide film or across the base material of silicon. This phenomenon is also called as "charging damage".

This often occurs by the difference in amount of the flowing-in charged particles, which occurs, especially when the wafer bias voltage is applied, due to slight difference of the applied bias voltage caused by the difference in impedance to the earth between the wafer surface positions.

A conventional countermeasure against the above is to take a method of preventing the charging damage by using a conductive ring at an outer periphery of the wafer. However, since this method relies on a method of locally changing the plasma density at the periphery, it is difficult, in case of processing a wafer of large diameter of 12 inches or larger, to satisfactorily suppress the damage in the gate oxide film as the gate oxide film of the large-diameter wafer becomes more and more thin, because the area where the plasma density is balanced is small.

Also, when the above device is manufactured by using a wafer of a large diameter, it is required to maintain the etchant density uniform within the wafer surface in order to achieve uniformity of etching with respect to the shape over the wafer surface. Especially, in order to suppress the excess etchant at a peripheral part of a wafer of a large diameter, it has been done to provide an etchant consuming ring at the wafer periphery and applying a bias thereto thereby maintaining the uniformity over the surface.

However, the bias current flowing through the ring provided to the wafer periphery also causes the impedance of the wafer periphery to change, thereby changing the amount of electric charges flowing into the wafer which adversely affects the charging damage characteristics.

U.S. Pat. No. 5,535,507 issued to Barnes et al discloses a technique of compensating for unequality in etching of a workpiece by using an electrostatic chuck which supports the workpiece by electrostatic attracting force between the workpiece and an electrode. However, this U.S. patent fails to teach a method of compensating for charging damage which is intended by the present invention.

JP-A-8-316212 discloses another technique in which an electrode portion of a wafer mount is divided into a plurality of electrically isolated areas, impedance matching elements are connected to respective areas so as to control the impedances thereof, and alternatively, a recessed portion is provided on the electrode surface of the wafer mount such that the impedances between the wafer and the electrode differ between the center portion and the outer portion of the electrode to make ion energy emitted to the wafer uniform over the entire surface, thereby achieving a uniform plasma process. However, this technique also does not refer to the compensation for charging damage.

SUMMARY OF THE INVENTION

An object of the present invention is to provide a plasma processing device capable of processing a high speed semiconductor device sensitive to damage by charge-up and having a delicate structure by using a wafer of a large diameter at a high yield and a method of processing the same.

The present inventors have invented an etching apparatus capable of making a gate oxide film thinner and also capable of, when processing a wafer of a large diameter, making high the uniformity of etching and making less the damage of the devices formed in the wafer by a method different from a conventional one and a method of etching the same.

According to one aspect of the present invention, a plasma processing apparatus includes variable impedance means for adjusting a bias current distributed to a ring mounted at position surrounding a wafer, insulating material formed on a surface of a mounting electrode opposing to a rear surface of a wafer to be processed and having a part which is thicker than other parts thereof and an inner electrode provided inside the part of the insulating material. A bypassed bias current is supplied to the inner electrode and variable impedance means is provided to adjust the bias current supplied to the inner electrode. The bias current supplied to the ring mounted at an outer periphery of the wafer is adjusted so as to make uniform the etching characteristics on the wafer surface according to the process condition such as the plasma etching process condition and then the bias current supplied to the inner electrode positioned inside the wafer surface is adjusted so as to make the electrostatic damage minimum.

According to another aspect of the present invention, a plasma processing method using a plasma processing apparatus, which is capable of applying a bias electric power to a substrate to be processed and a material adjacent to a main rear surface of the substrate, is provided to include the steps of providing an electrode for supporting the substrate to be processed and changing a feeding impedance for a bias power depending on a position on the electrode so as to make electrons injected to the substrate (wafer) to be processed uniform within a surface of the wafer.

According to still another aspect of the present invention, a plasma processing method used in a plasma processing apparatus for manufacturing a semiconductor device is provided to comprise the steps of applying a bias power to a substrate to be processed and a material adjacent to the substrate, adjusting a feeding impedance for the bias power applied to the material adjacent to the substrate to be processed and adjusting a feeding impedance for the bias power applied to plural positions on the substrate to be processed so as to make uniform the electrons of the incident plasma within the surface of the substrate.

Other objects, features and advantages of the present invention will become apparent from the following description of the embodiments of the invention taken in conjunction with the accompanying drawings.

DETAILED DESCRIPTION OF THE EMBODIMENTS

Now embodiments of the present invention will be described with reference to the accompanying drawings. First, FIG. 2 shows a first embodiment of the present invention.

Figure 1:
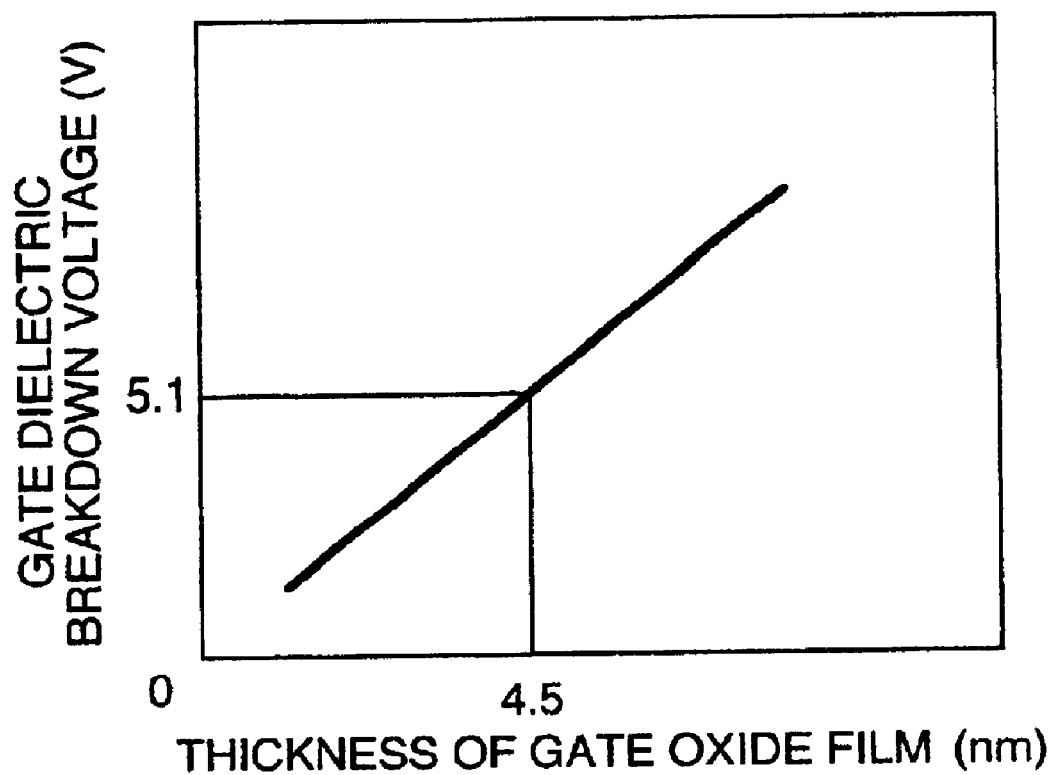
FIG. 1 is a diagram showing the relation between the thickness of the gate oxide film and the dielectric breakdown voltage.
Figure 2:
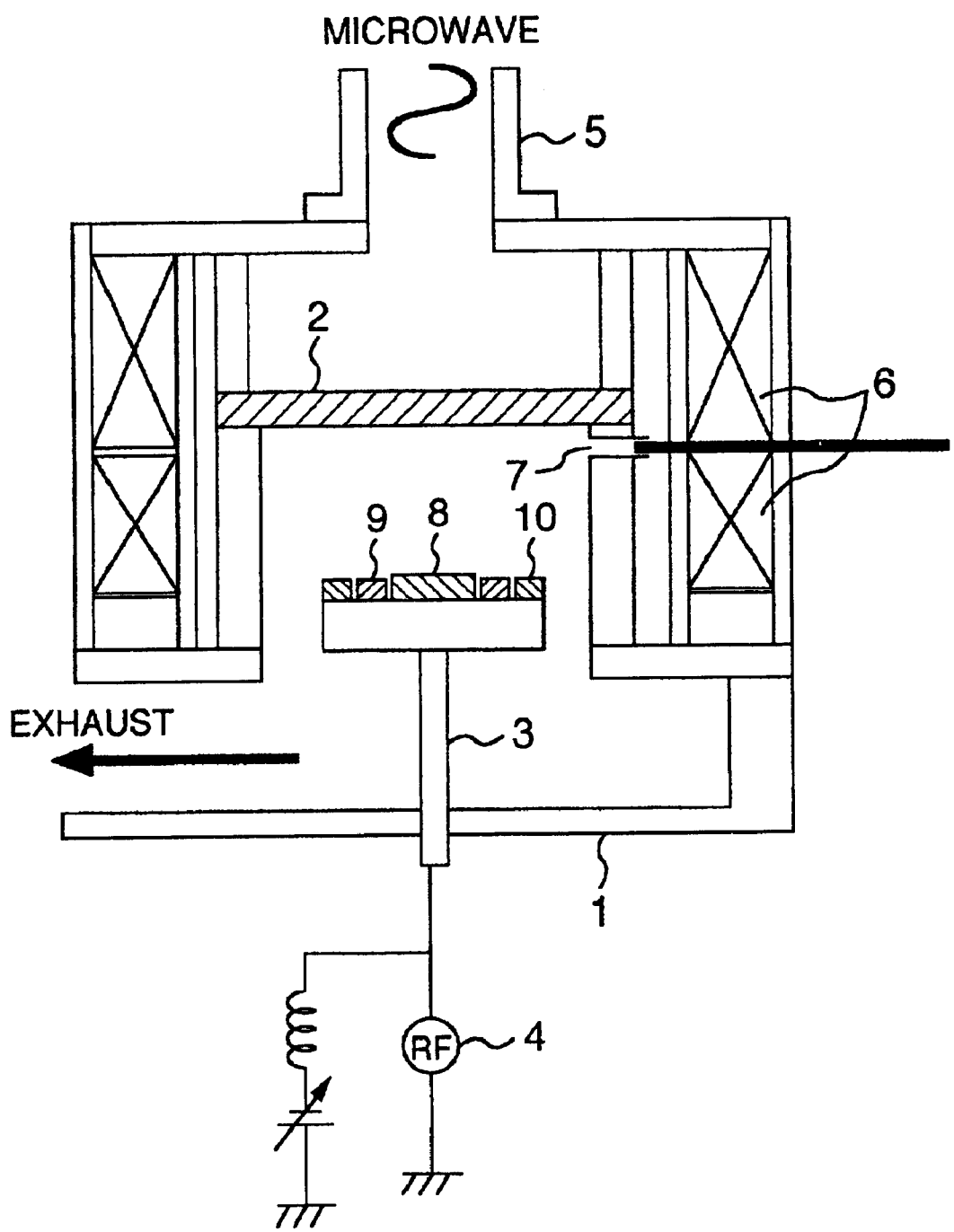
FIG. 2 is a sectional view along a longitudinal direction of dry etching device according to one embodiment of the present invention.

FIG. 2 is a diagram of microwave dry etching device. Here, 1 denotes a vacuum processing chamber, 2 a quartz window hermetically formed in the vacuum processing chamber 1 for introducing a microwave into the chamber 1 3 an electrode arrangement or stage provided in the vacuum processing chamber opposing to the quartz window 2 for mounting thereon a wafer 8 having a semiconductor integrated circuit, 4 a high frequency power source for applying a bias voltage to the electrode arrangement 3, and 6 a solenoid coil for forming a magnetic field in the vacuum processing chamber 1. 7 is a gas introducing opening through which a gas mixed according to an etching recipe is introduced into the vacuum processing chamber 1. 9 is a ring made of silicon provided for consuming excess etchant, and 10 a ring made of aluminum provided at outer periphery of the ring 9.

Figure 3:
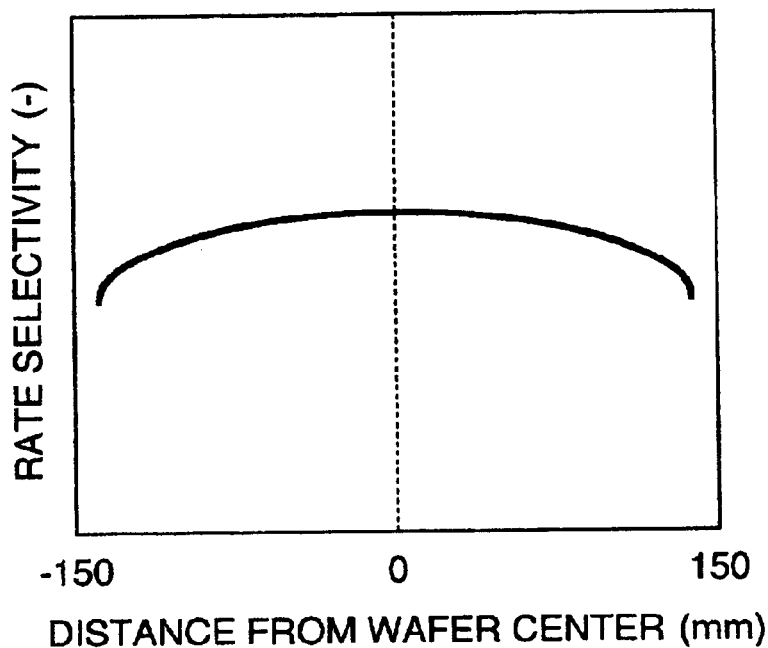
FIG. 3 is a diagram showing the distribution of the rate selectivity between the silicon oxide film and an undercoat silicon within the wafer surface when the outer diameter of the silicon ring 9 is 1.4 times of the wafer diameter.
Figure 4:
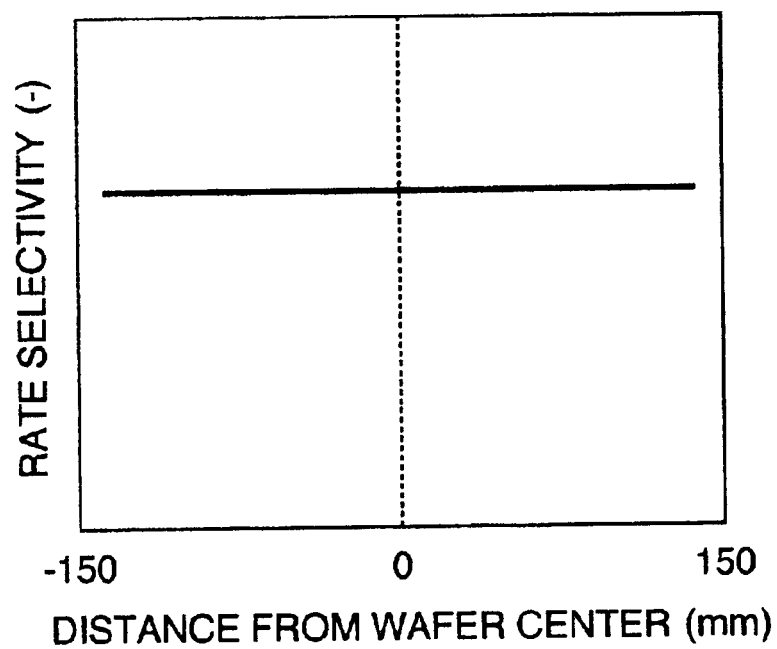
FIG. 4 is a diagram showing the distribution of the rate selectivity between the silicon oxide film and an undercoat silicon within the wafer surface when the outer diameter of the silicon ring 9 is 1.2 times of the wafer diameter.

In the case of forming a pattern in a silicon oxide film by etching using the device of the present invention, when the outer diameter of the silicon ring 9 is 1.4 times of the wafer diameter, the selection ratio between the silicon oxide film and an undercoat silicon within the wafer surface is distributed so as to be higher at the periphery of the wafer as shown in FIG. 3. This is because the etchant of silicon, i.e. fluorine is less in the periphery than the center of the wafer. In this case, by making the diameter of the silicon ring 9 1.2 times of the wafer diameter, it is possible to obtain a uniform distribution of fluorine within the wafer surface and to make the distribution of the selection ratio uniform as shown in FIG. 4.

Figure 5:
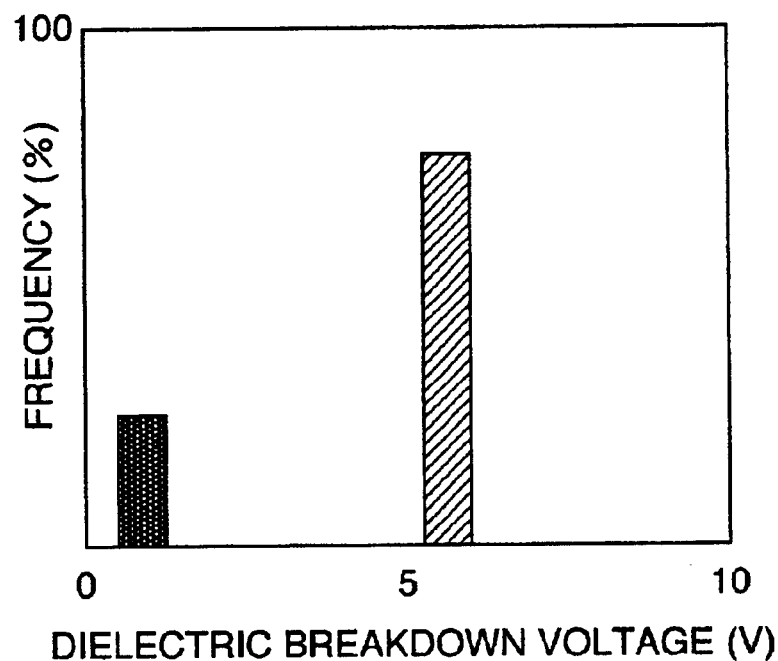
FIG. 5 is a histogram of the dielectric breakdown voltage distributed over the wafer surface when the outer diameter of the silicon ring 9 is 1.2 times of the wafer diameter.
Figure 6:
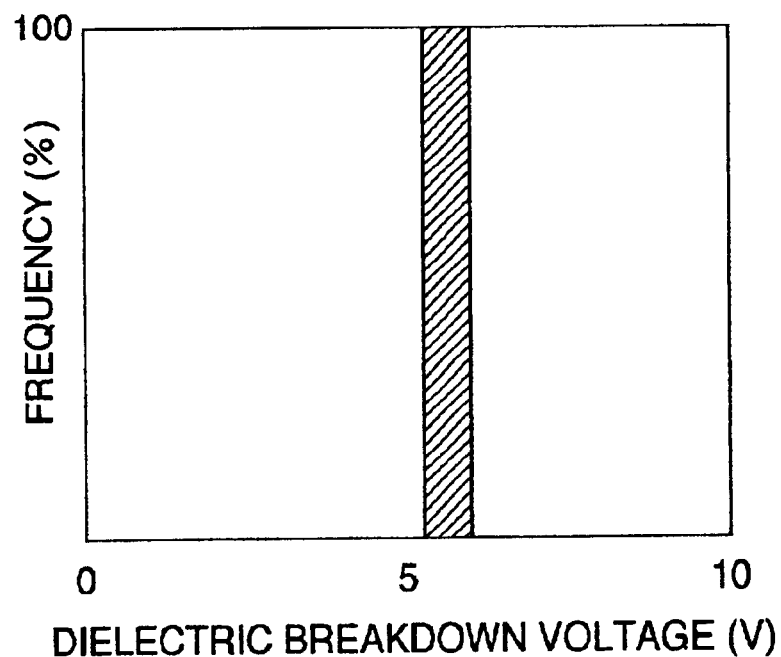
FIG. 6 is a histogram of the dielectric breakdown voltage distributed over the wafer surface when the outer diameter of the silicon ring 9 is 1.4 times of the wafer diameter.

However, it is seen from the test of dielectric breakdown by charging damage of the gate oxide film that when the diameter of the silicon ring is 1.4 times of the wafer diameter, no deterioration occurs due to charging damage as shown in the dielectric breakdown histogram of FIG. 6, while when the diameter of the silicon ring is 1.2 times of the wafer diameter, the deterioration occurs in about 20% due to charging damage as shown in the dielectric breakdown histogram of FIG. 5.

This is because the bias current flowing from the silicon ring to the plasma becomes smaller as the diameter of the silicon ring becomes smaller and thereby the bias current flows more readily at the periphery of the wafer due to smaller interference with the bias current in the wafer periphery so that unequality is produced in the electric charges flowing within the wafer surface.

Figure 7:
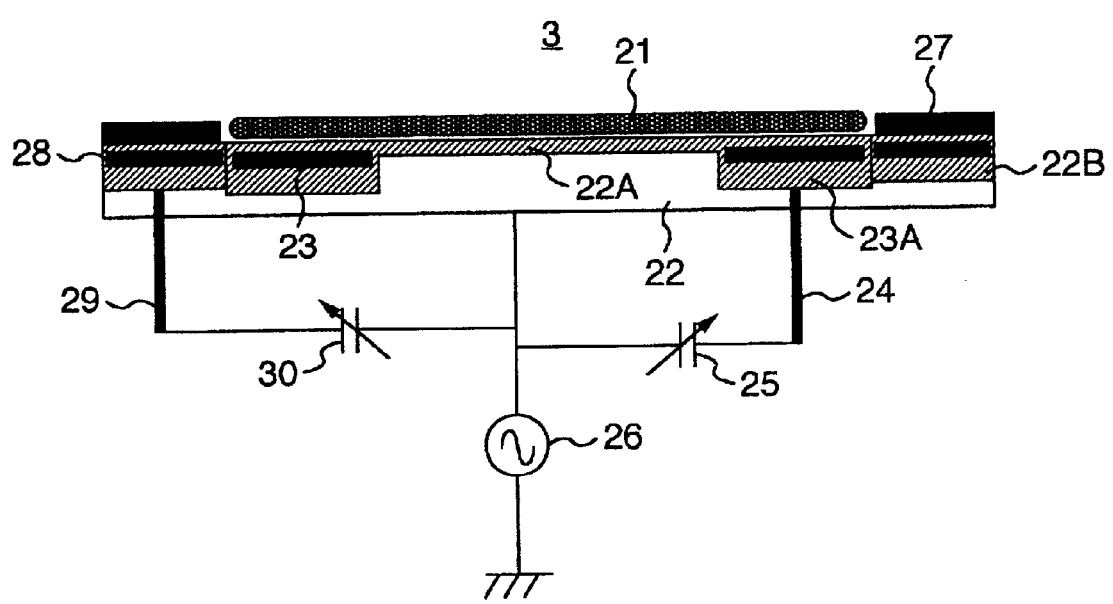
FIG. 7 is a sectional view of one embodiment of the present invention including a wafer-mounting electrode and a silicon ring.

Then, it was proposed to solve the above problem by using the method of the present invention so as to incorporate the electrode arrangement 3 of the present invention including the wafer mounting electrode 22 and the silicon ring 27, as shown in FIG. 7, into the apparatus of FIG. 2

The electrode arrangement 3 for mounting a wafer 21 composed of an electrode 22 which is made of aluminum and an alumina film 22A which is coated by sputtering on the surface of the electrode 22. The alumina film is coated at a thickness such that the thickness at the ring portion, i.e. a part outside of its inner part having a diameter of two thirds of the electrode diameter is three times of the thickness at the inner part. Also, an electrode 23 of tungsten is buried at the ring portion at a depth of one thirds of the thickness of the electrode from its surface and connected to a feeder line 24 which is insulated from the electrode material. This feeder line 24 is connected through a variable capacitor 25, together with the electrode to a bias power source circuit 26. The variable capacitor 25 is capable of being either short-circuited or opened and having a capacity variable from infinite to zero.

Further, the silicon ring 27 has an outer diameter of 1.5 times of the wafer diameter and is disposed on the electrode 22. The thickness of the alumina film 22B at a portion where the silicon ring 27 is disposed is two times of the thickness of its center portion. In the insulating film, an electrode 28 of tungsten is buried and connected to the electrode material through a feeder line 29 and a variable capacitor 30.

This device of the present invention has been used for etching the above silicon oxide film. First, the etching is carried out by setting the capacitance of the variable capacity 30 connected to the silicon ring 27 at 10,000 pF and the capacitance of the variable capacitor 25 connected to the tungsten electrode 23 at 1,500 pF. In this case, the distribution of the selection ratio within the wafer surface is high in the peripheral portion of the wafer surface like the above-mentioned. Then, only the capacitance of the variable capacitor 30 connected to the silicon ring is changed to 7,300 pF. In this case, the distribution of selection ratio is uniform within the wafer surface. However, the examination of the dielectric breakdown due to charging damages at this condition indicates that the breakdown has occurred at a frequency of 18%. Then, the capacitance of the variable capacitor 25 connected to the tungsten electrode has been changed to 850 pF. Then, the test was again carried out and it was found that the selection ratio is uniform within the wafer surface and the frequency of the breakdown due to charging damages is reduced to 0%. This is because the bias current of the silicon ring 27 is reduced by making smaller the capacitance of the variable capacitor 25, thereby cancelling the tendency of increasing the bias current at the periphery of the wafer.

The present invention has been used for etching a sample in which the pattern formed on a silicon oxide film is different. In this case, the capacitance of the variable capacitor connected to the silicon ring 27 is 1000 pF and the capacitance of the variable capacitor 25 connected to the tungsten electrode 23 is 1300 pF. By this arrangement, it is possible to carry out the etching with uniform distribution of the selection ratio within the wafer surface and without generation of the charging damages.

Figure 8:
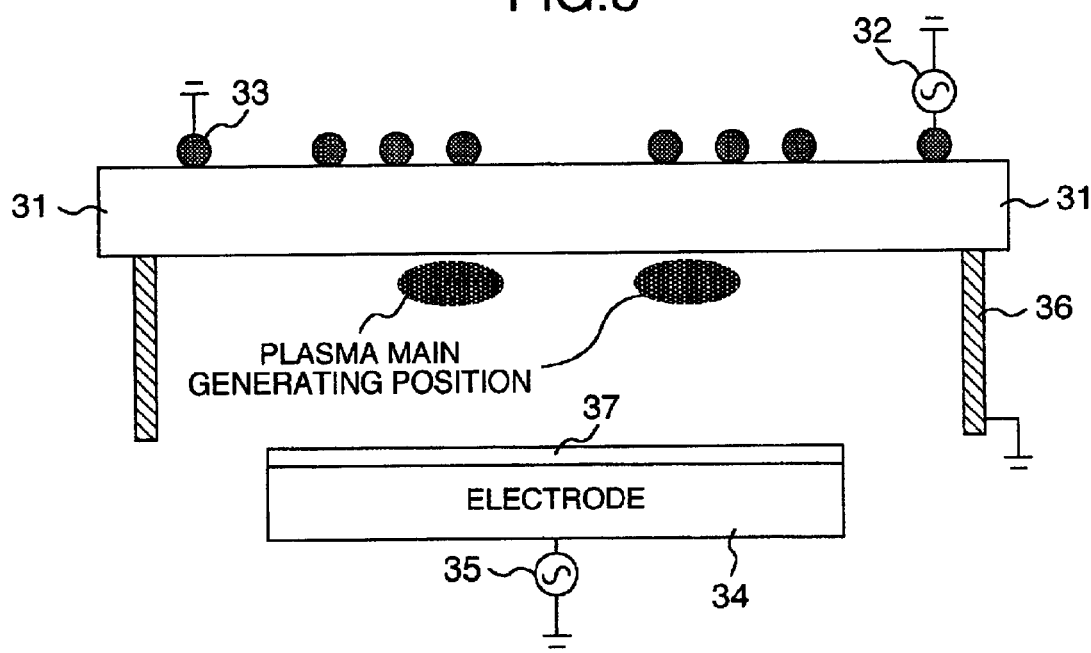
FIG. 8 is a sectional view of dry etching device according to another embodiment of the present invention.

Next, another embodiment using a high density plasma etching apparatus (plasma processing apparatus) will be described with reference to FIG. 8. In FIG. 8, 31 is an introducing window on which a coil 33 is mounted. By supplying an electric power to the coil 33 from a high frequency power source 32, a plasma is produced between the window 31 and the wafer mounting electrode 34. In this case, the coil is disposed with unequal spaces between its coil windings in order to make uniform the processing rate within the wafer surface so that the plasma main generating positions are distributed in a doughnut shape as shown in FIG. 8.

By applying a voltage from a bias electric power source 35 connected to the wafer mounting electrode 34, ions produced from the plasma are accelerated and projected onto the wafer to conduct etching process. The earth connection 36 is effective to make possible the application of bias, while fixing the plasma potential.

Figure 9:
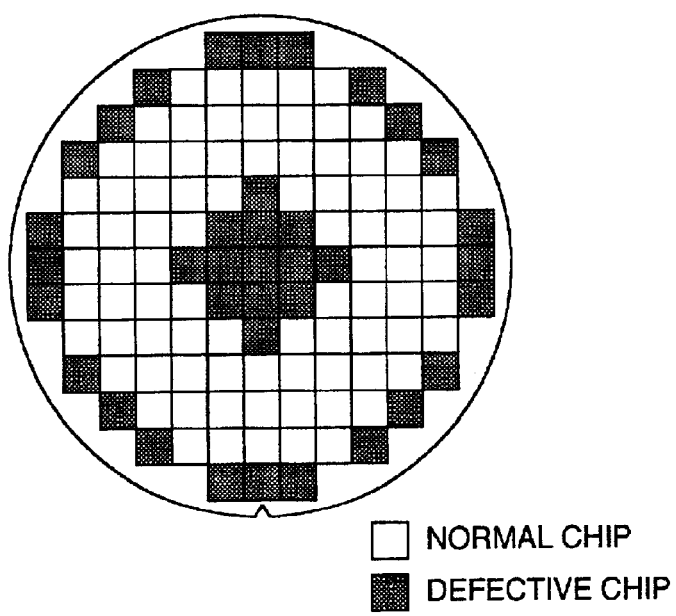
FIG. 9 exemplarily shows generation of damages on a wafer when a conventional wafer-mounting electrode assembly is used in the device of FIG. 8.

After an etching process was carried out by using the above etching apparatus and adjusting the process condition so as to obtain desired working configuration, the characteristics of the gate oxide film was measured and as a result, it was found that defective chips are generated as shown in FIG. 9.

Figure 10:
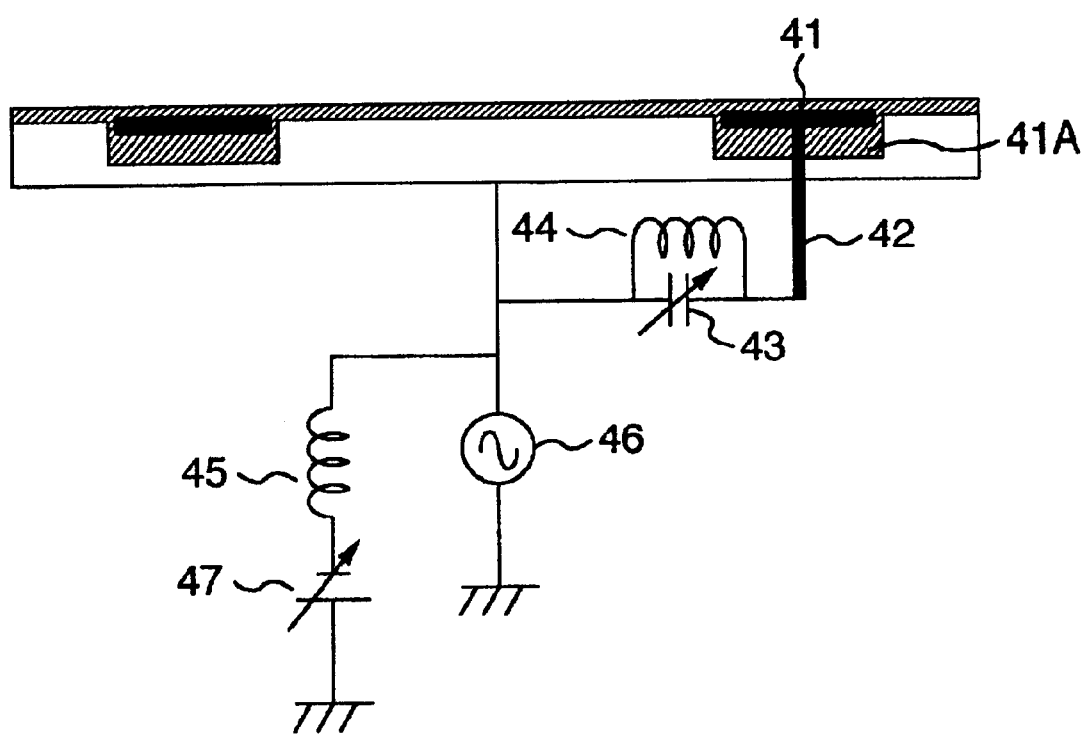
FIG. 10 is a schematic diagram of wafer-mounting electrode assembly according to another embodiment of the present invention to be used in the device of FIG. 8.

This is because the bias impedance is reduced at positions opposing to the plasma main generating positions within the wafer surface and thereby the potential produced by the bias is varied depending on the positions on the wafer surface. In this case, as shown in FIG. 10, by disposing the portion, where the thickness of the alumina is larger than other portions and the electrode 41 is embedded, at a position opposing to the plasma main generating position and adjusting the capacitance of the variable capacitor 43, it is possible to reduce the rate of defective chips due to charging damages to 0%. Incidentally, in FIG. 10, 42 is a feeder line, 44 and 45 are resonance coils, 46 a bias high frequency power source, and 47 a variable D.C. power source.

The present invention is capable of processing high-speed devices sensitive to damage due to charge-up and having delicate structure by using a wafer of large diameter at a high yield.

What is claimed is:

1. A plasma processing method for processing a substrate using a plasma comprising the steps of:

mounting the substrate which is processed by the plasma on an electrode;

applying high frequency bias power to the substrate and a material adjacent to a main rear surface of the substrate for accelerating ions in the plasma; end changing a feeding impedance for the high frequency bias power depending on a position on the electrode so as to make charged particles injected to the substrate from the plasma uniform within the surface of the substrate.

2. A plasma processing method utilized in a plasma processing apparatus for manufacturing a semiconductor device, said method comprising the steps of:

applying high frequency bias powers to a substrate and a material adjacent to said substrate for accelerating ions in the plasma;

adjusting feeding impedances for the high frequency bias power applied to said material adjacent to said substrate; and adjusting feeding impedances for the high frequency bias powers to plural positions on the substrate so as to make charged particles projected to the substrate from the plasma uniform within a surface of said substrate.

3. A plasma processing method according to claim 2, wherein said substrate is a semiconductor wafer and said material is a conductive ring surrounding said semiconductor wafer.

4. A plasma processing method for processing a substrate using a plasma apparatus comprising the steps of:

mounting said substrate on a mounting table within a processing chamber;

generating a plasma within said processing chamber;

applying a high frequency bias power to said mounting table on which said substrate is mounted and an electrode electrically insulated from said mounting table within a rear surface of said substrate for accelerating ions in the plasma, and a member adjacent to said substrate; and changing feeding impedances of said high frequency bias power in said mounting table, said electrode and said member adjacent to said substrate so that charged particles from the generated plasma are injected uniformly to said mounted substrate within the surface of the substrate.

5. A plasma processing method according to claim 4, wherein said substrate is a semiconductor wafer and said member adjacent to said substrate is an electrically conductive ring surrounding said semiconductor wafer.

* * * * *